(12) United States Patent
Horiguchi

(10) Patent No.: US 6,414,341 B1
(45) Date of Patent: Jul. 2, 2002

(54) INPUT/OUTPUT PROTECTIVE DEVICE

(75) Inventor: Yoko Horiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/401,129

(22) Filed: Sep. 22, 1999

(30) Foreign Application Priority Data

Sep. 25, 1998 (JP) .......................................... 10-271431

(51) Int. Cl.7 ............................................ H01L 27/10
(52) U.S. Cl. ........................ 257/203; 361/111; 361/56; 361/58
(58) Field of Search ................................ 257/203, 763, 257/355, 356, 357, 358, 360, 363; 361/111, 56, 58, 91

(56) References Cited

U.S. PATENT DOCUMENTS

| | | | | | |
|---|---|---|---|---|---|
| 4,481,521 A | * | 11/1984 | Okumura | ...................... | 357/23 |
| 4,819,046 A | * | 4/1989 | Misu | ........................... | 357/51 |
| 5,019,883 A | * | 5/1991 | Mori | ........................... | 357/51 |
| 5,401,989 A | * | 3/1995 | Kikuchi | ...................... | 257/211 |
| 5,724,219 A | * | 3/1998 | Narita | ........................ | 361/111 |
| 5,936,283 A | * | 8/1999 | Narita | ........................ | 257/355 |
| 6,060,784 A | * | 5/2000 | Oda | ............................ | 257/758 |
| 6,091,149 A | * | 7/2000 | Hause | ........................ | 257/758 |
| 6,107,666 A | * | 8/2000 | Chang | ........................ | 257/391 |

FOREIGN PATENT DOCUMENTS

| | | |
|---|---|---|
| JP | 2-210838 | 8/1990 |
| JP | 3-248567 | 11/1991 |
| JP | 5-267579 | 10/1993 |
| JP | 6-232345 | 8/1994 |
| JP | 8-24183 | 3/1996 |
| JP | 10-50833 | 2/1998 |
| JP | 2000-40788 | 2/2000 |

* cited by examiner

Primary Examiner—Olik Chaudhuri
Assistant Examiner—Nathan W. Ha
(74) Attorney, Agent, or Firm—Sughrue Mion, PLLC

(57) ABSTRACT

The present invention provides an excellent input/output protective device which has a withstand voltage of 200 V or more in device simulation tests according to the EOS/ESD standard. There is presented an input/output device having a protective element that prevents external noise from degrading the internal circuit therein by inducing an electric discharge between diffusion layers of the second conductive type thereof which are disposed on a semiconductor substrate of the first conductive type and facing each other; wherein there are equipped with a plurality of contacts each of which connects a metal wiring layer with a diffusion layer; and a contact at the end section of the protective element on the side of the input section, at least, is provided with a means to increase the resistance thereof so as to make that larger than the resistance of the other contacts.

11 Claims, 9 Drawing Sheets

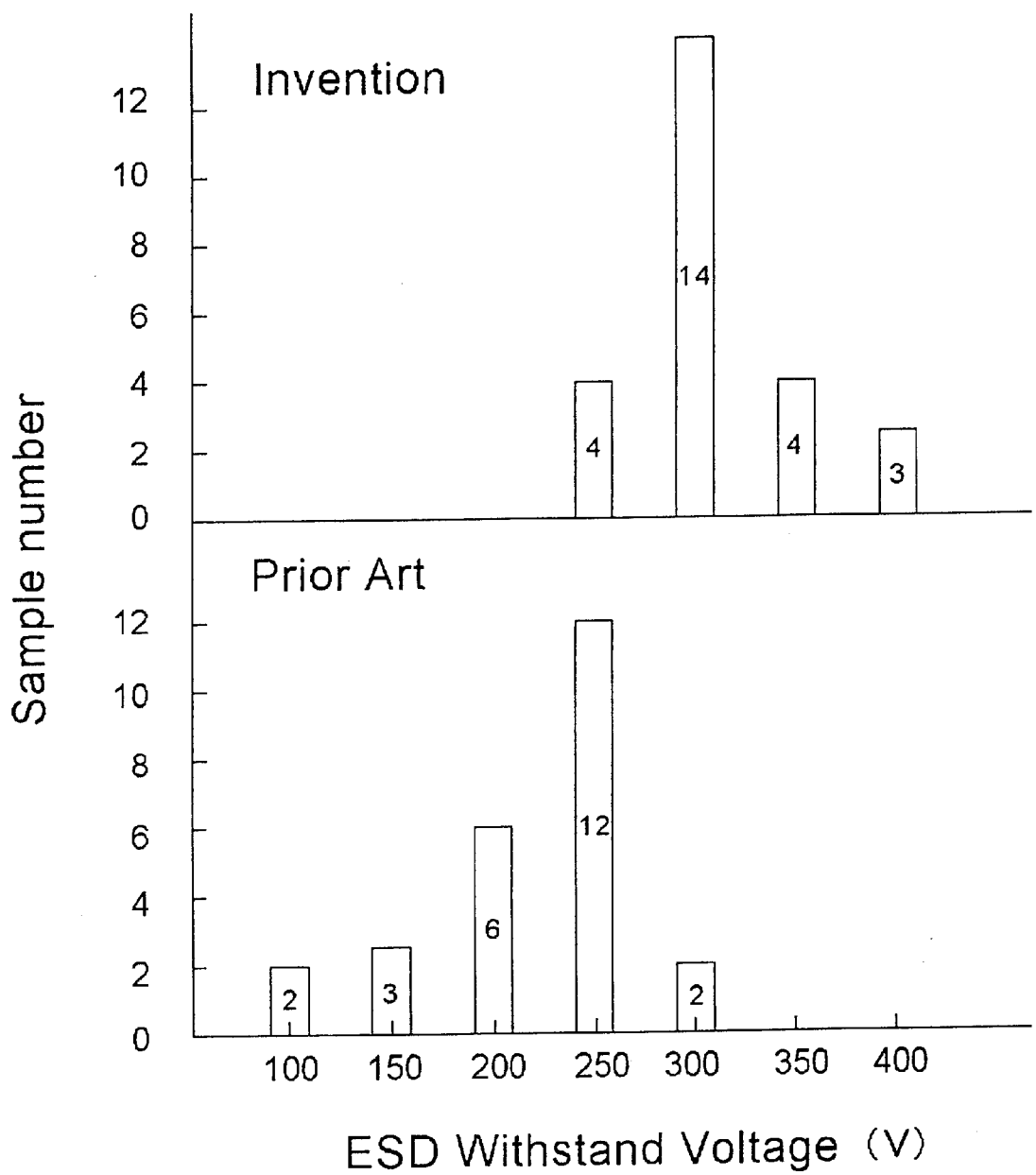

Simulation Model
EIAJ process L=10μH, C=20pF, R=10Ω
EOS/ESD process L=0.5μH, C=7pF, R=10Ω

INPUT/OUTPUT PROTECTIVE DEVICE

BACKGROUND OF THE INVENTION

1. Field of the Invention

The present invention relates to an input/output (I/O) protective device that protects an internal circuit in a semiconductor device from external noise such as a surge and the static electricity, and more particularly to an input/output protective device capable to provide a protection even against high voltage external noise having rapid rising characteristics.

2. Description of the Related Art

A semiconductor device, in general, comprises an internal circuit to realize a prescribed function, a pad that is connected to this internal circuit and used for input and output of signals and a lead terminal being connected to this pad. This lead terminal is then connected with an electric circuit outside, when required. An input/output protective device for a semiconductor device is set between the internal circuit and the pad for input/output, and if external noise such as a surge and the static electricity is applied to the lead terminal, the input/output protective device prevents such external noise to degrade the internal circuit therein by inducing an electric discharge in a protective element that comprises a transistor, a diode or the like.

For instance, in JP-A-3-248567, there is disclosed a structure in which aluminum wiring 31 of a drain node and a source node are, respectively, connected to a conductive layer 36 through contacts 33 and this conductive layer 36 is connected to a diffusion layer 34 through a contact 35 having an elongated contact hole, as shown in FIG. 8. When external noise such as a surge is applied thereto, this structure prevents the electric field centralization on a certain region of the diffusion layer 34 from developing and, thus, a contact therein from being degraded.

Further, JP-B-8-24183 discloses that, in a semiconductor device that has, as shown in FIG. 9, a first diffusion region 46 and a second diffusion region 48, both of which are substantially rectangular in shape and formed in an element region isolated by a field oxide film 42, sandwiching a gate electrode 42, and contact apertures 41 and 47 disposed in these first and second diffusion regions, the electric field centralization is liable to develop on a boundary point 43 in a corner section of the first diffusion region 46 on the gate electrode side, which easily leads to the generation of the electrostatic stress. For the purpose of overcoming this problem, the invention in said publication discloses a structure, wherein recess sections 45 are set in each corner section of the first diffusion region 46 on the opposite side to the gate electrode 44 and formed in such a way that the ratio of the length L of the side of said recess section which is substantially parallel to the boundary line between the first diffusion region 46 and the gate electrode 44 to the distance d from this side to the gate electrode is 1.5 or more. In this instance, setting recess sections 45 in the first diffusion region 46 lengthens the path from a contact aperture 41 to the boundary point 43 and increases the diffusion resistance, and thereby the electric field centralization on the boundary point can be made to relax.

With respect to such an input/output protective device, the protective ability thereof has been, hitherto, evaluated by the machine model method (referred to as the MM method, hereinafter), the human body method (referred to as the HBM method, hereinafter) or the like. The standard of the actual test method for the MM method is being defined by the Electronic Industries Association of Japan (referred to as EIAJ, hereinafter) and, in the U.S., by the EOS/ESD Association. The MM method in conformity with the EIAJ is referred to as the EIAJ method, and the MM method in conformity with the EOS/ESD Association, as the EOS/ESD method, hereinafter.

FIG. 6(a) illustrates the set-up of a test device. In the test method for the MM method, a capacitor $C_0$ with a capacitance of 200 pF is charged to a prescribed test voltage and electrostatic discharge is applied to a lead terminal (not shown in the drawing) connected with a pad 53 of a semiconductor device 100, and then the evaluation of the voltage level to cause the breakdown of the semiconductor device is made. In practice, a test operator first applies a voltage of 50 V to a capacitor $C_0$ as a test voltage and then turns on a switch SW, actuating the electrostatic discharge which is applied to a protective element 101 through a lead terminal and a pad 53 in each semiconductor device 100. After that, using a tester (not shown in the drawing), the test operator carries out the function test for the semiconductor devices 100 to find out whether each semiconductor device 100 can operate normally or not, and counts the number of degraded semiconductor devices 100. Subsequently, the test operator performs similar tests at a number of test voltages increased every 50 V and repeats Lt counting the number of degraded semiconductor devices 100 each time.

FIG. 6(a) shows a simulation model of the test according to the MM method for obtaining the waveform of a current flowing through the protective element 101 in the semiconductor device 100 by means of calculation, while FIG. 6(b) shows a plan view of the semiconductor device 100. The simulation model shown in FIG. 6(a) is composed of a test device 200 and the semiconductor device 100 to be tested. The test device 200 consists of a capacitor $C_0$ with a capacitance of 200 pF that is to be charged to a test voltage and a parasitic inductor L, a parasitic resistor R and a parasitic capacitor C of the test device 200 as well as a switch SW to apply the test voltage to the semiconductor device 100.

The semiconductor device comprises a protective element formed on a P-type substrate 51, a pad 53 connected thereto and a lead terminal (not shown in the drawing) connected thereto. The protective element 101 has two $N^+$-diffusion layers 52a and 52b and these $N^+$-diffusion layers 52a and 52b are disposed at a given space, facing each other. Between the $N^+$-diffusion layers 52a and 52b, the P-type substrate 51 is present so that the protective element 101 shown in FIG. 6 forms an NPN parasitic transistor. An insulating film 54 is formed over the $N^+$-diffusion layers 52a and 52b, and metal wirings 55a and 55b are formed thereon. The metal wirings 55a and 55b are connected through contacts 56a–56e and 57a–57e to the $N^{30}$-diffusion layers 52a and 52b, respectively. Further, the $N^+$-diffusion layer 52a is connected through the metal wiring 55a and the pad 53 to the lead terminal (not shown in the drawing), while the $N^+$-diffusion layer 52b is connected through the metal wiring 55b and a contact 58 to the P-type substrate 51 and consequently to the ground.

Using the device simulator for the semiconductor device 100, the present inventors conducted simulation with the equivalent circuit shown in FIG. 6 to find out what effects these evaluation test methods, EIAJ method and EOS/ESD method, have on the actual protective element 101, respectively.

In the test device 200 shown in FIG. 6(a), for the EIAJ method, the parasitic capacitor C had a capacitance of 20 pF, the parasitic inductor L, an inductance of 10 $\mu$H and the parasitic resistor R, a resistance of 10Ω, while, for the EOS/ESD method, the parasitic capacitor C had a capacitance of 7 pF, the parasitic inductor L, an inductance of 0.5 µH and the parasitic resistor R, a resistance of 10Ω. Further, in the calculation, the test voltage to charge the capacitor $C_0$ with a capacitance of 200 pF was taken to be 50 V.

FIGS. 7(a) and (b) show the results of the simulation when the test voltage was applied, for the EIAJ method and the EOS/ESD method, respectively. In these graphs, the value of the current flowing the test device 200 to the protective element 101 in the semiconductor device 100 is plotted in vertical axis, and the elapsed time after the switch SW was turned on is plotted in horizontal axis.

As shown in FIGS. 7(a) and (b), in the EIAJ method, the peak value of the discharge current is small but the time period for which the discharge current flows into the protective element is considerably long, while, in the EOS/ESD method, the time period for which the discharge current flows is short but the peak value of the discharge current flowing into the protective element is four or more times that in the EIAJ method.

This demonstrates that, although it was, hitherto, sufficient for the protective element to withstand the test voltage of 200 V in the EIAJ method, the performance criteria that the protective element is required to satisfy is recently being heightened. That is, the protective element is asked for, not only to satisfy the performance criteria set for the test in the EIAJ method but also to have a withstand voltage of 200 V of more in the testing of the EOS/ESD method.

The evaluation and examination of the results of the above simulation by the present inventors indicated that contacts 56a and 56e situated at the outermost sections of the $N^+$-diffusion layer 52a which constituted the protective element 101 were destroyed in the EOS/ESD method. The reason for this is thought to be as follows.

As in the EIAJ method, when a positive high-voltage pulse having a relatively slow rising characteristic is applied to the pad 53, electric charges of this pulse are transferred to the parasitic NPN transistor which constitutes the protective element 101 and the breakdown takes place initially at the PN junction between the $N^+$-diffusion layer 52a and the P-type substrate 51. The corner sections 59 (FIG. 6(b)) of the $N^+$-diffusion layer 52a are particularly liable to this breakdown. The breakdown at the corner sections 59 generates holes within the P-type substrate 51 and these holes raise the substrate potential locally. As the time passes, the breakdown regions spread towards the central section (in the vicinity of the contact 56c) of the $N^+$-diffusion layer 52a, which raises the potential of the P-type substrate further and causes the parasitic NPN transistor to start operating. Accordingly, in the case that a positive high-voltage pulse having a relatively slow rising characteristic is applied, an almost equal amount of the currents flow into every contact and no destruction of the internal circuit occurs.

However, when a positive high-voltage pulse having a rapid rising characteristic is applied, as in the EOS/ESD method, although the breakdown take place initially around the corner sections 59 of the $N^+$-diffusion layer 52a in the same way as mentioned above, discharge currents are thought to flow locally to the opposite $N^+$-diffusion layer 52b before the breakdown regions spread towards the central section (in the vicinity of the contact 56c) of the $N^+$-diffusion layer 52a. Therefore, large currents flow into contacts 56a and 56e at the end sections that are adjacent to the corner sections 59 of the $N^+$-diffusion layer 52a. The currents flowing out from contacts 56a and 56e then flow into contacts 57a and 57e at the end sections of the opposite $N^+$-diffusion layer 52b, respectively, so that large currents tend to converge into contacts 57a and 57e at the end sections on the side of the opposite electrode, as well. This brings about the destruction of the contacts 56a, 56e, 57a and 57e at the end sections. As a result, the protective element 101 presumably becomes incapable to make the external noise induce a sufficient electric discharge and a high voltage becomes applied to the internal circuit, which brings about the destruction of the internal circuit.

Accordingly, for the EOS/ESD method wherein a large current flows for a short time, even if a diffusion layer 34 is connected through a conductive layer 36 as in the prior art shown in the afore-mentioned FIG. 8, the discharge current flows down through a contact 33a at the end section directly into the underlying diffusion layer 34 without waiting for the charges to spread over the entire conductive layer 36 uniformly. Therefore, that part of the diffusion layer 34 or the contact 33a itself is easily destroyed, indicating that the protection of the internal circuit given thereby is, in fact, insufficient.

Further, with respect to the prior art shown in FIG. 9, although there is provided a protection against the electrostatic breakdown at the boundary point 43 of the first diffusion layer 46 on the side of the gate electrode 44, there is provided no protection against the destruction of the contact section 41 whatsoever. Furthermore, because securing the distance d to the gate electrode as well as recess sections 45 is an essential condition for this prior art, the area of the protective element becomes substantially large, which becomes the primary cause to increase the chip area.

SUMMARY OF THE INVENTION

An object of the present invention is to provide an excellent input/output protective device capable to protect the internal circuit even when external high-voltage noise having a rapid rising characteristic is applied.

In light of the above problems, the present inventors conducted an investigation and found out successively that the above problems can be overcome by providing a means to abate, at least, a large current flowing rapidly into contacts disposed on the side of the input/output section.

Accordingly, the present invention relates to an input/output protective device having a protective element that prevents external high-voltage noise from entering the internal circuit by inducing an electric discharge between diffusion layers which are disposed on a semiconductor substrate and facing each other; wherein:

there are equipped with a plurality of contacts each of which connects a metal wiring layer with a diffusion layer; and a contact at the end section of the protective element on the side of the input section, at least, is provided with a means to increase the resistance thereof so as to make that larger than the resistance of the other contacts.

The present invention also relates to an input/output protective device in which a first diffusion layer connected to an input/output terminal and a second diffusion layer connected to a ground or supply potential or to a wiring fixed at a predetermined potential are arranged as facing each other on a surface of a semiconductor substrate, wherein the device comprises a number of contacts for connecting wiring layers to the diffusion layers, and the length of the first diffusion layer is larger at the both end section than the length of the second diffusion layer by at least one contact pitch length.

In the present invention, a contact connecting a wiring with a diffusion layer at the end section on the side of the input/output, at least, is provided with a means to increase the resistance thereof, and thereby, even when a rapidly rising pulse is applied, the discharge current does not converge to the contact at the end section to which the preventive arrangement is given so that the destruction of the contact at the end section does not occur. Accordingly, the present invention enables to provide an excellent input/output protective device with a higher withstand voltage than the conventional ones, contributing a good deal to enhance reliability of the semiconductor device.

BRIEF DESCRIPTION OF THE DRAWINGS

FIG. 5 is a pair of graphs showing the results of the ESD withstand voltage for the case the present invention is applied and for the conventional case that is not.

DETAILED DESCRIPTION OF THE PREFERRED EMBODIMENTS

Figure 1:
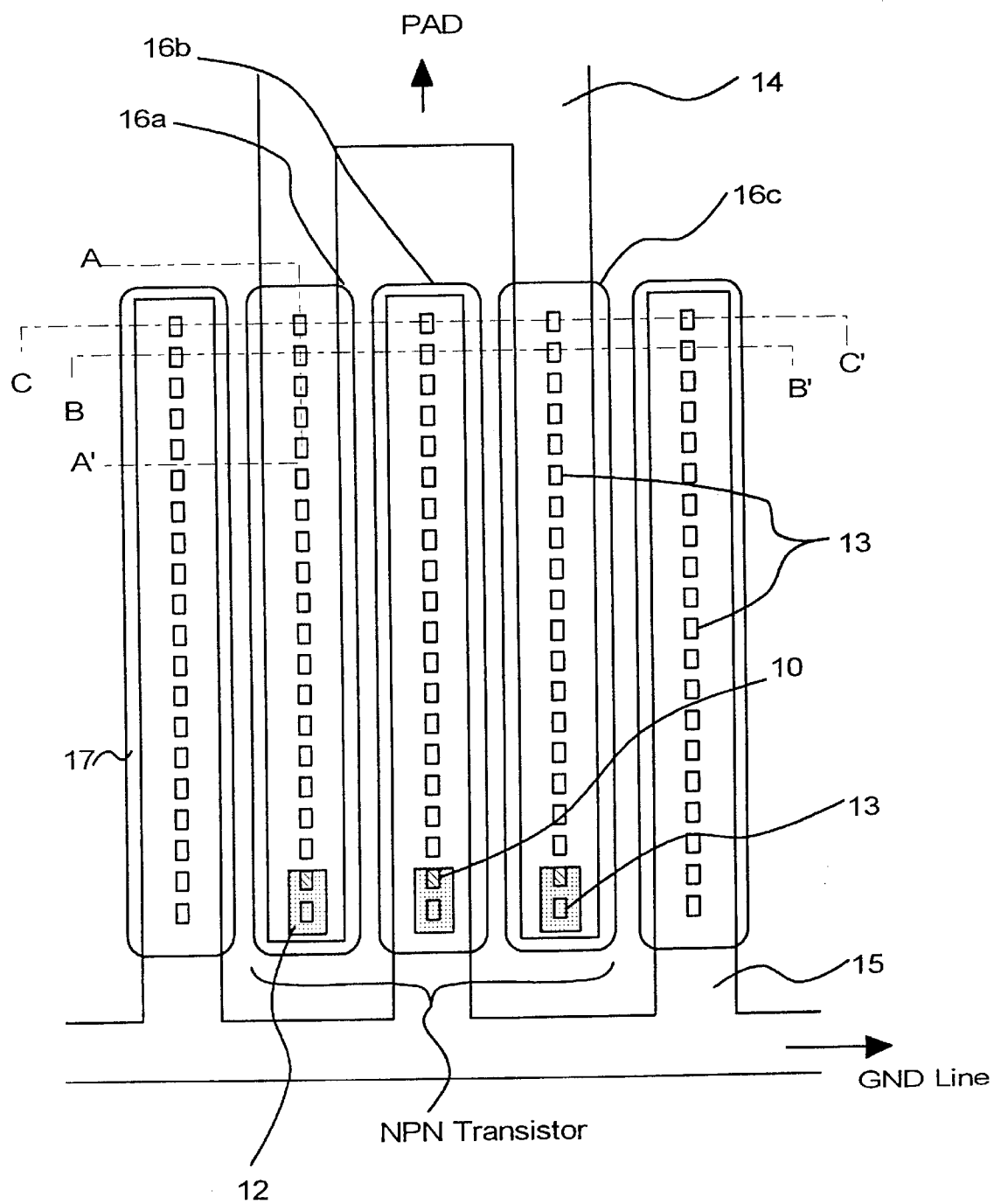
FIG. 1 is a plan view in explaining an embodiment of the present invention.
Figure 2A:
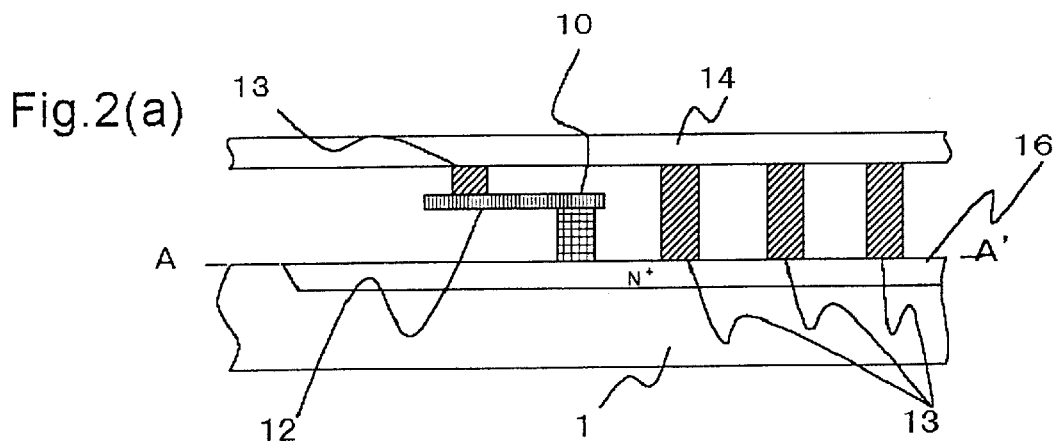
FIGS. 2(a) to 2(c) are a group of cross-sectional views taken along the line A–A', the line B–B' and the line C–C'shown in the plan views of FIG. 1, respectively.
Figure 2B:
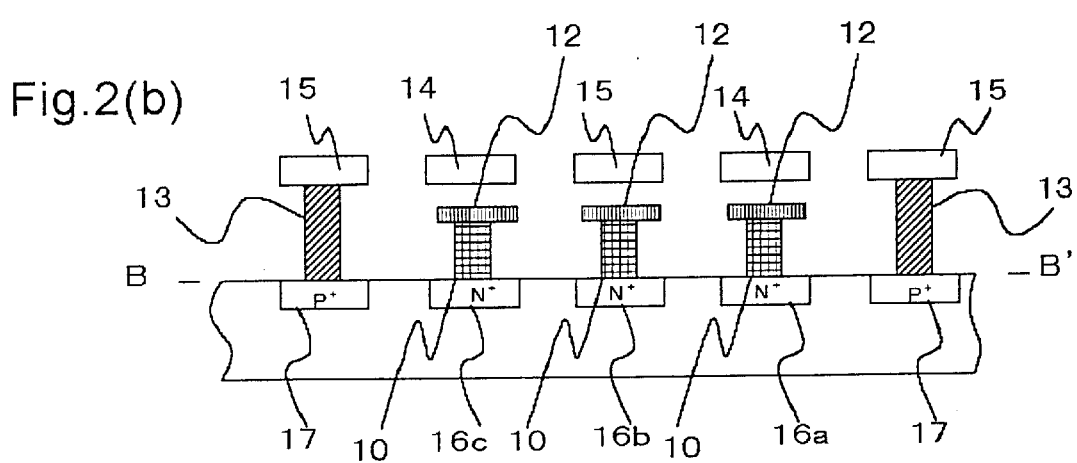
Figure 2C:
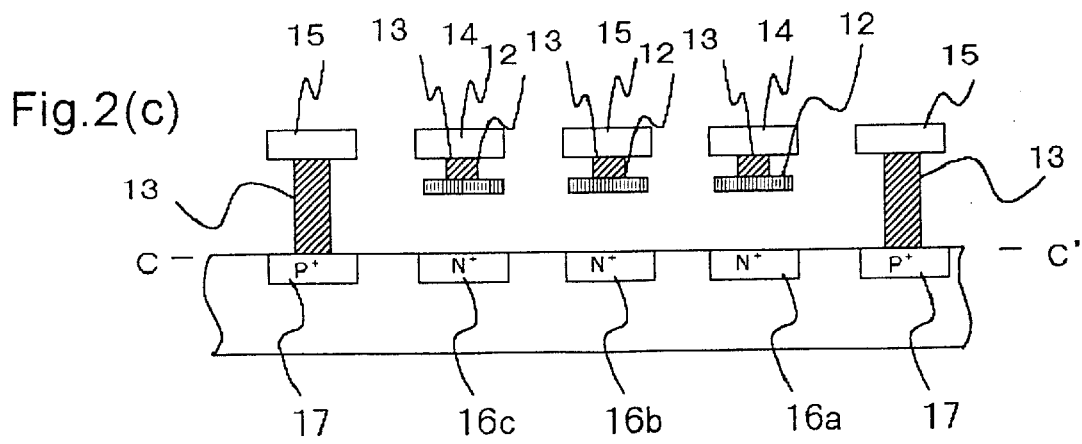

Referring to the drawings, the present invention is described in detail, below.
First Embodiment FIG. 1 is a schematic plan view of an input/output protective device that is an embodiment of the present invention and FIG. 2 is a group of cross-sectional views taken along the line A–A', the line B–B' and the line C–C' shown in FIG. 1, respectively. As shown in FIGS. 1 and 2, in an input/output protective device according to the present invention, over a P-type semiconductor substrate 1 of the first conductive type, a plurality of $N^+$-diffusion layers 16a–c of the second conductive type, each rectangular in shape, are disposed at given spaces, parallel to one another and $P^+$-diffusion layers 17 are placed to sandwich those $N^+$-diffusion layers 16. Together with the P-type semiconductor substrate and the $N^+$-diffusion layer 16b, the $N^+$-diffusion layers 16a and 16c each constitute a parasitic NPN transistor which functions as a protective element. The protective element as referred to herein is an element (such as a parasitic NPN transistor) that constitutes an input/output protective device. The input/output protective device itself is a general term for protective circuits composed of a pair or a plurality of parasitic NPN transistors (protective elements), and protective circuits composed of a combination of a plurality of parasitic NPN transistors (protective elements) and a plurality of parasitic PNP transistors (protective elements).

An aluminum wiring 14 connected with an input/output (I/O) pad and an aluminum wiring (metal wiring layer) 15 connected with a ground line are each connected through contacts (10, 13) to diffusion layers ($N^+$-diffusion layer 16, $P^+$-diffusion layer 17). Further, as shown in FIG. 2(a), an intermediate wiring 12 made of tungsten silicide is formed at the end section of contacts. This intermediate wiring 12 is connected through a first contact 10 to an $N^+$-diffusion layer 16, and through a second contact 13 to an aluminum wiring 14. In other words, among contacts at the end section, in a part along the line B–B', first contacts 10 are connected with the $N^+$-diffusion layers 16, and in a part along the line C–C' second contacts 13 are connected with aluminum wirings 14 and 15, and these first contacts 10 and second contacts 13 are further connected to each other through intermediate wirings 12. The first contact 10 therein is made of tungsten silicide and the second contact 13, of aluminum or tungsten.

In this manner, a resistive layer in the form of the intermediate wiring 12 is set, at least, for a contact at the end section and, through this resistive layer, the aluminum wiring 14 to which external noise is applied and the $N^+$-diffusion layer 16a which constitutes the protective element are connected to each other. Even when external high-voltage noise with a rapidly rising characteristic is applied thereto, this arrangement prevents the discharge currents that flow towards the end section of the $N^+$-diffusion layer 16a from converging to the contact at the end section and, thus, no destruction of the contact at the end section occurs. Further, by setting a similar resistive layer to a contact of an opposite $N^+$-diffusion layer 16b at the end section, the destruction of the contact at the end section on the side of the opposite electrode can be prevented.

The part such an arrangement for prevention is given must include at least the nearest contact to the I/O pad, but, as shown in FIG. 1, the contact at the other end section may also be provided with the same arrangement. The arrangement for the nearest contact to the I/O pad serves to prevent the incoming external noise from converging thereat, while the arrangement for the other end-prevention contact serves to suppress the discharge current which flows due to electric charge accumulated at the end section of the $N^+$-diffusion layer 16a.

Further, the opposite electrode in the parasitic NPN transistor (the central $N^+$-diffusion layer 16b in FIG. 1) may be given with the similar preventive arrangement. Furthermore, a contact next to the contact at the end section that is provided with the preventive arrangement may be also given with the similar arrangement but with a lower resistance than said contact at the end section. The preventive arrangements may be applied to one contact after another in the similar manner towards the center. Further, without forming the intermediate wiring 12, the $N^+$-diffusion layer 16a and the aluminum wiring 14 may be connected to each other through the first contact, and this first contact may be filled with a metal material having a higher value of resistivity than the material for the second contact.

In the present invention, the desired effect can be obtained by making the resistance of the contact at the end section have a higher value than the ones for the other contacts, preferably making the value thereof twice or more and more preferably thrice or more that of the others, although the actual effect depends on many other factors such as the number of contacts used for the connection with the $N^+$-diffusion layer 16a, the space between contacts, the contact resistance and required withstand voltage conditions. Further, because the contact with an excessively high resistance may cause the destruction of a contact nest to the contact provided with the preventive arrangement, the resistance thereof is preferably not exceeding ten times that of the other contacts.

The adjustment of the resistance can be made by any method out of the following ones: that is, an alternation of the space between the first contact and the second contact, an alternation of the length, the material or the thickness of the intermediate wiring through which the first contact is connected with a second contact and a change of the filling material for the first contact to the one having a higher resistivity than that for the second contact. Further, in the case that the preventive arrangements are applied to one contact after another towards the center as mentioned above, the adjustment method is not limited to these.

Second Embodiment

Figure 4:
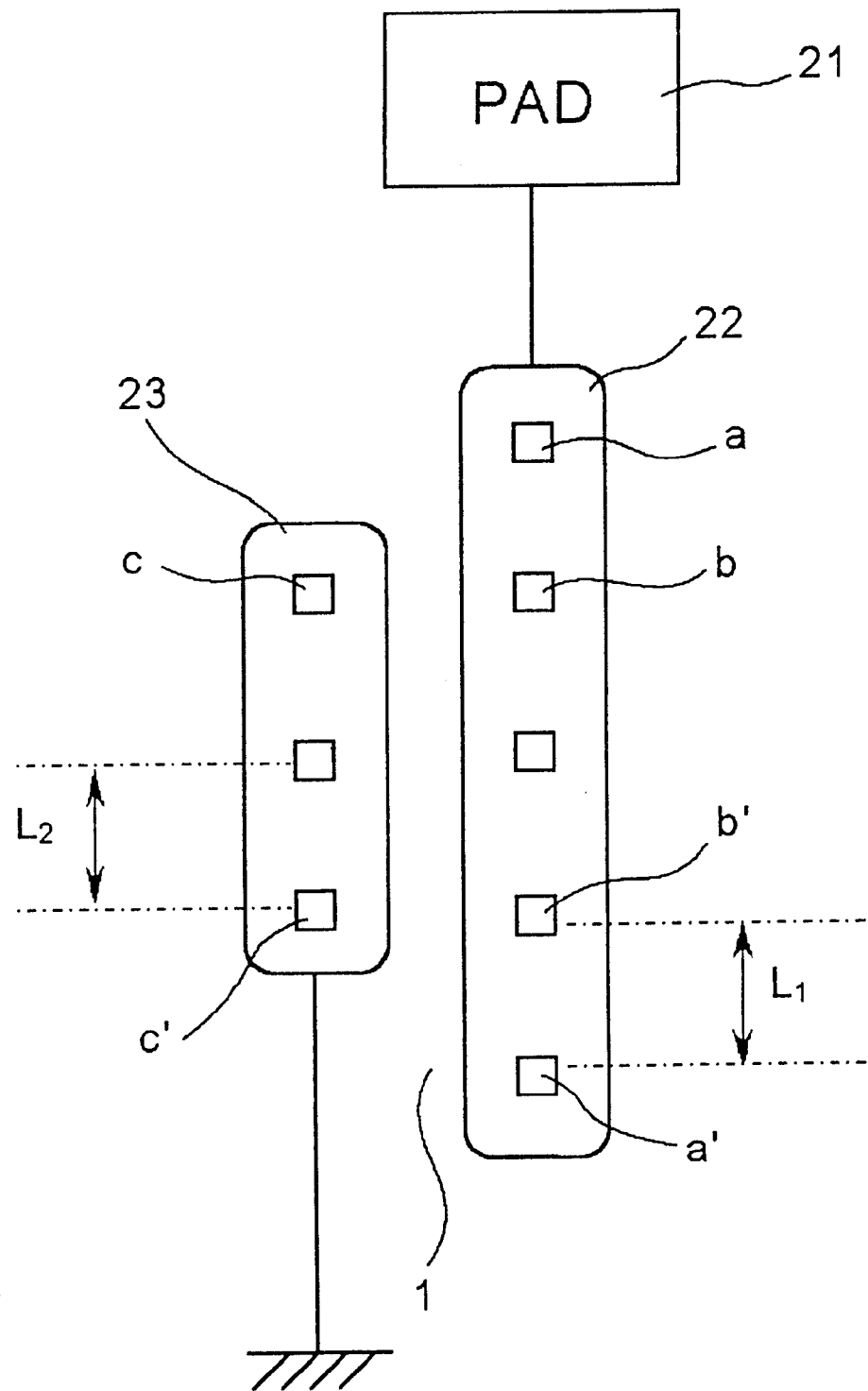
FIG. 4 is a schematic view of an input/output protective device that is another embodiment of the present invention.

FIG. 4 is a schematic view of an input/output protective device that is the second embodiment of the present invention.

In the present invention, among a number of contacts for an aluminum wiring connected to an input/output pad and a diffusion layer, if a distance between one contact at the end section and the diffusion layer of the opposite electrode is made longer than a distance for the other contacts, the resistance for the contact at the end section can be increased.

As shown in FIG. 4, rectangular $N^+$-diffusion layers 22 and 23 are formed on a P-type semiconductor substrate. The $N^+$-diffusion layers 22 and 23 are disposed at a given space, parallel to each other and a P-type semiconductor substrate is present between the $N^+$-diffusion layers 22 and 23. The $N^+$-diffusion layer 22, the P-type semiconductor substrate and the $N^+$-diffusion layer 23 constitute a parasitic NPN transistor, which functions as a protective element.

The $N^+$-diffusion layer 22 is connected through contacts (a, b, . . . b', a') to an aluminum wiring (not shown in the drawing) and subsequently to an input/output (I/O) pad 21. Similarly, the $N^+$diffusion layer 23 is connected through a contact c to an aluminum wiring (not shown in the drawing) and subsequently to the ground.

With respect to contacts of the $N^+$-diffusion layer 22 connected to the I/O pad 21, one extra contact is set at each outer side of the contact array which is corresponding to a contact array in the diffusion layer 23 of the opposite electrode, and thereby a distance from contacts (a, a') at the end sections on the outer side to contacts (c, c') of the opposite electrode becomes longer than a distance from contacts (b, b') on the input side to contacts (c, c') of the opposite electrode so that convergence of the current to contacts (a, a') can be reduced.

Such a reduction of the current convergence to contacts at the end sections which connect the I/O pad 21 with the $N^+$-diffusion layer 22 can prevent the destruction of contacts at the end sections as well as the breakdown of the internal circuit.

Further, it is preferable that a contact pitch L, for one extra contact to be set at each outer side is equal to or greater than the contact pitch $L_2$ of the opposite electrode.

As described so far, in the conventional input/output protective device making use of a parasitic NPN transistor, a plurality of contacts for a diffusion layer and a wiring connected to an I/O pad are formed in such a way that the resistance for respective contacts are all the same. Therefore, in the steady state, an equal amount of current flows into every contact. An idea that the resistance of the contact at the end section is made to increase or an idea that the discharge current is prevented from converging to a specific contact in a transient state, both of which are presented in the present invention, are novel ideas. Further, it is to be understood that a means to increase the resistance thereof is not limited to the ones described above as an example and those skilled in the art may make an appropriate modification and variation without departing from the spirit and the scope of the invention.

Further, in describing the above embodiments, a parasitic NPN transistor is taken as an example of the protective element, but the present invention is not limited thereto and may utilize, as the protective element, a thyrister or a MOSFET (Metal-Oxide-Semiconductor Field Effect Transistor) in which an opposite diffusion layer has a source-drain region and a source electrode is connected with a gate electrode. Further instead of on a P-type semiconductor substrate, the parasitic NPN transistor may be formed in a P-well or the parasitic PNP transistor may be formed in N-well. Further, an arrangement in which a parasitic NPN transistor is set between the I/O pad and the ground and a parasitic PNP transistor is set between the I/O pad and a power supply may be employed so as to be able to cope with positive and negative external noises.

While the present invention is further described below with reference to the specific examples, it is to be understood that the present invention is not limited to these examples and various changes and modifications may be made without departing from the spirit and the scope of the invention.

EXAMPLE 1

Referring to the drawing, an example of the present invention is described. FIGS. 3(a)–(g) are a series of cross-sectional views showing the steps of a manufacturing method of an I/O protective device according to the present invention. To illustrate this, the steps of manufacturing method of a DRAM, together with those of a memory cell section thereof (shown on the left side) are used as an example.

First, in a prescribe region on a P-type semiconductor substrate, a thick oxide film is formed to a thickness of about 300 nm, as an element isolation region 2. Next, a gate oxide film 3 for a MOS transistor is formed to a thickness of about 10 nm and gate polysilicon film 4 which are to serve as either a gate electrode of a transistor or word lines in the memory cell section are formed. Either the gate polysilicon film 4 have a single-layered structure made of about 200 nm-thick polysilicon or a double-layered structure made of about 200 nm-thick polysilicon and about 100 nm-thick tungsten silicide. In order to form a source-drain region of the MOS transistor in the memory cell as well as $N^+$diffusion layers 5 and 16 in I/O protective regions, arsenic (As) is ion implanted under the condition that a dose is $2 \times 10^{15}$ cm$^{-2}$ (FIG. 3(a)).

Figure 3A:
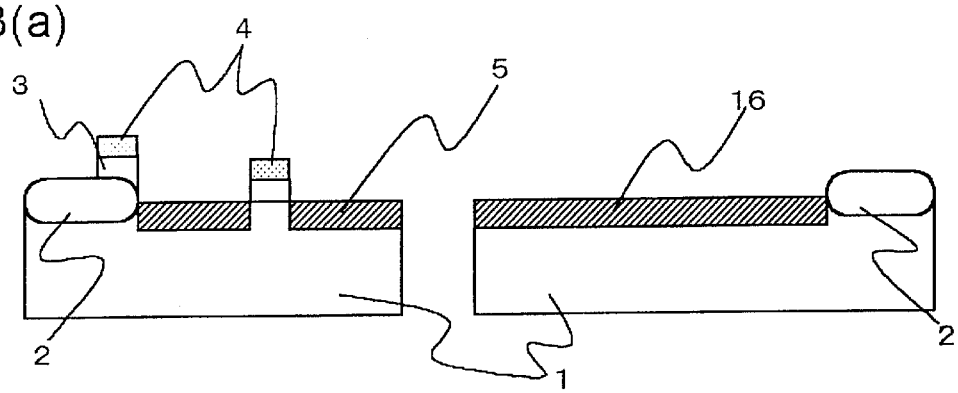
FIGS. 3(a) to 3(g) are a series of cross-sectional views in explaining the steps of a manufacturing method of an input/output protective device that is an embodiment of the present invention. To illustrate this, the steps of a manufacturing method of a DRAM (Dynamic Random Access Memory), together with those of a memory cell section thereof (shown on the left side) are used as an example.
Figure 3B:
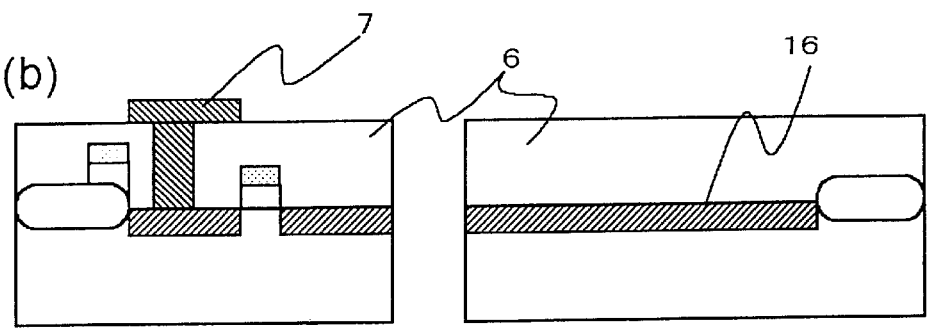
Figure 3C:
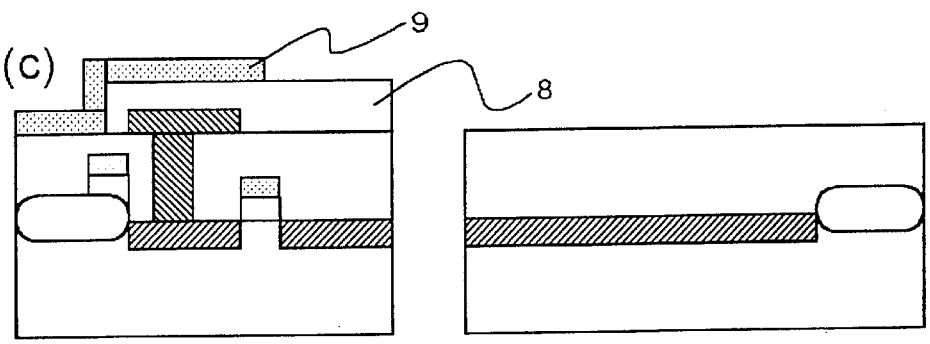
Figure 3D:
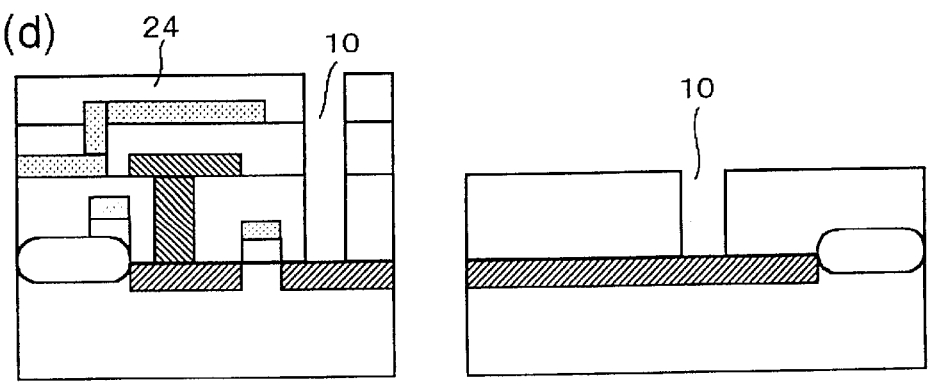

After an insulating film 6 is formed over the entire surface of the element (as thick as about 200 nm above the gate electrode), a contact hole is formed to reach the $N^+$-diffusion layer 5 of the MOS transistor, and then polysilicon is grown thereon so as to form selectively a capacitor electrode 7 used for the charge storage in the memory cell section (FIG. 3(b)). Subsequently, a capacitor insulating film 8 of the memory cell is formed selectively in the memory cell section alone (to a thickness of 5 nm or so in terms of oxide film thickness), and thereafter an opposite capacitor electrode which is to serve as an opposite electrode to the capacitor electrode 7 is formed of polysilicon (FIG. 3(c)).

Further, after an insulating film 24 is formed to a thickness of about 400 nm, first contact holes (0.4 μm□) are formed both in the memory cell section and in the I/O protective section. These first contact holes 10 in the memory cell section connect the MOS transistor of the memory cell with a bit line that is to be formed in the next step of manufacturing process, while the other first contact holes 10 in the I/O protective section are to become contacts (first contacts) at the end section (FIG. 3(d)).

Figure 3E:
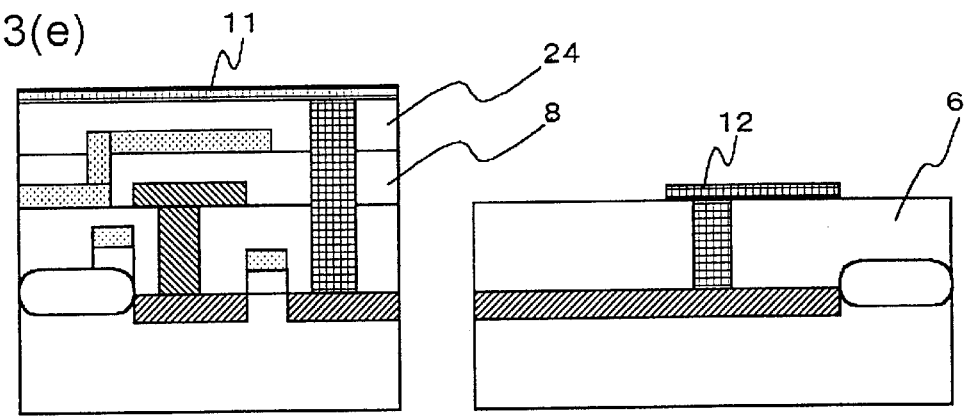

Next, tungsten silicide (WSi) is formed over said insulating film 24 to a thickness of 150 nm or so, filling said first contact holes 10 and forming a prescribed pattern at the same time (FIG. 3(e)). This layer of WSi forms, in the memory cell section, a bit line 11 and, in the I/O protective section, an intermediate wiring 12 that increases the contact resistance at the end section. An intermediate wiring 12 is set to be 2–3 μm in width and 3–5 μm in length, and a space between neighbouring contact holes is 0.5–1 μm . Since the intermediate wiring and the bit line are formed concurrently with the same material as described above, the steps of the conventional manufacturing process can be used, ads they are.

Figure 3F:
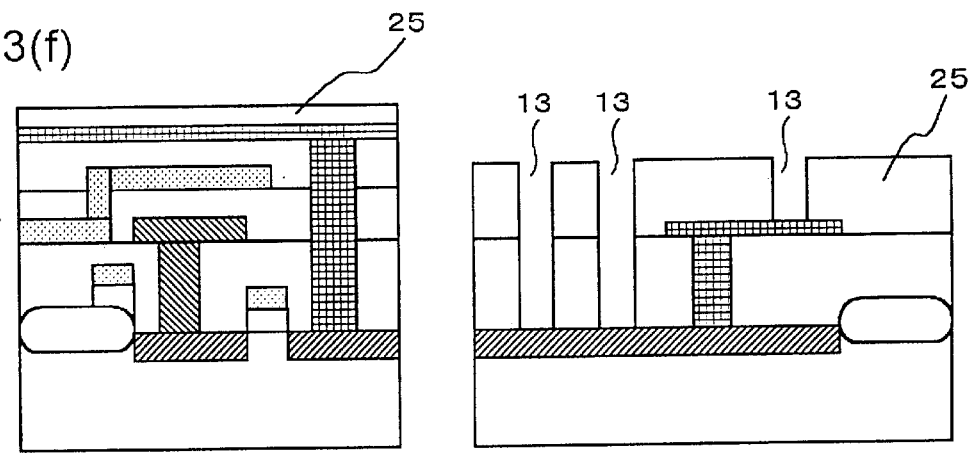

Further, after an insulating film 25 is grown to a thickness of 500 nm or so, second holes 13 (0.5 μm□) for connection with an aluminum wiring that is to be formed in the next step are made in the I/O protective section (FIG. 3(f)). In the memory cell section, no contact is formed for the cell itself hereat. However, for the purpose of lowering the resistance of the word line formed with polysilicon or the like, contacts are formed at given spaces in a connection section of an aluminum wiring that is to set parallel to the word line, though not shown in the drawing.

Figure 3G:
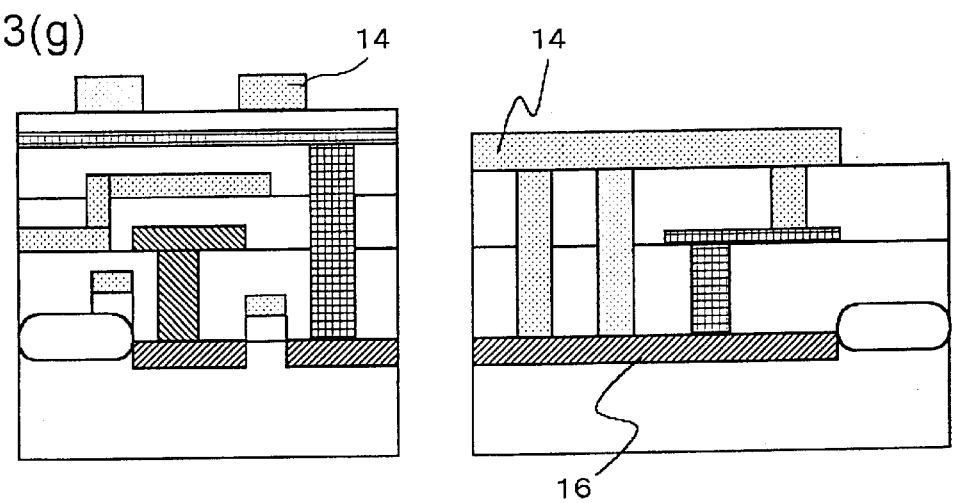

Finally, as shown in FIG. 3(g), second contacts 13 are buried with aluminum, simultaneously with forming selectively aluminum wirings 14 (film thickness: 900 nm; width: 2–3 μm). Further, second contact holes 13 may be buried with tungsten.

In the memory cell section, the aluminum wirings 14 are set, on the insulating film 25, parallel to the gate polysilicon 4 that are to serve as word lines. Meanwhile, in the I/O protective section, the aluminum wiring 14 is connected to the I/O pad 21 and another aluminum wiring 15 formed at the same time is connected to the ground line.

Further, after a passivation film is formed, openings for bonding pads or the like are made but the drawing for this is omitted herein.

For the present example, the resistance of respective contacts connecting the aluminum wiring 14 with the N$^+$-diffusion layer 16 was measured. The second contact touching the diffusion layer had a resistance of 120 Ω/item, while a double contact unit in which a first contact and a second contact are connected to each other through an intermediate wiring had a resistance of 640 Ω/item.

Figure 6A:
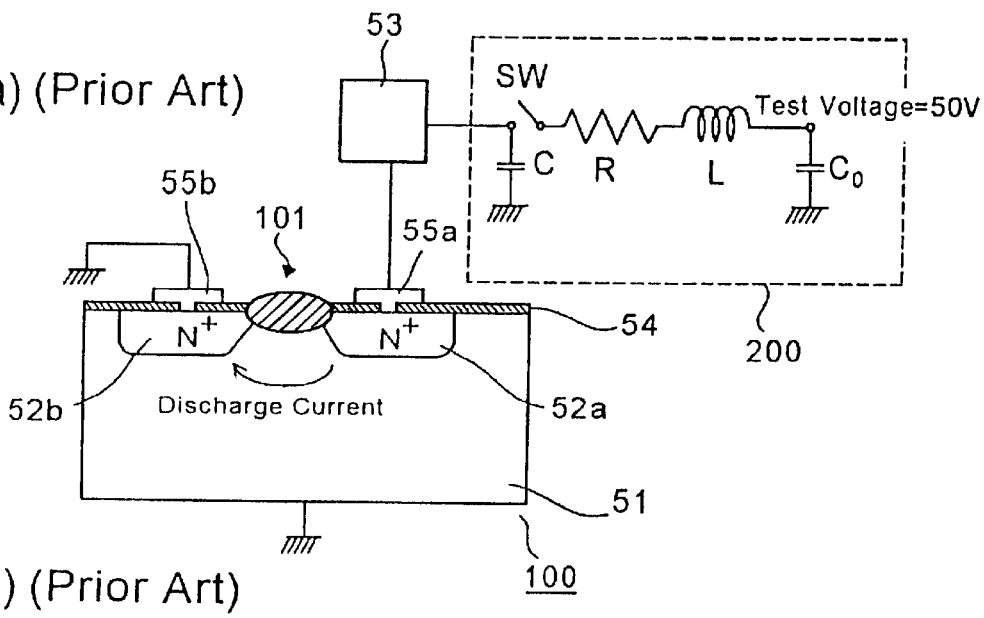
FIGS. 6(a) and 6(b) are a diagram of an equivalent circuit in explaining the device simulation for the conventional EIAJ method and for the EOS/ESD method that is performed in the present invention.
Figure 6B:
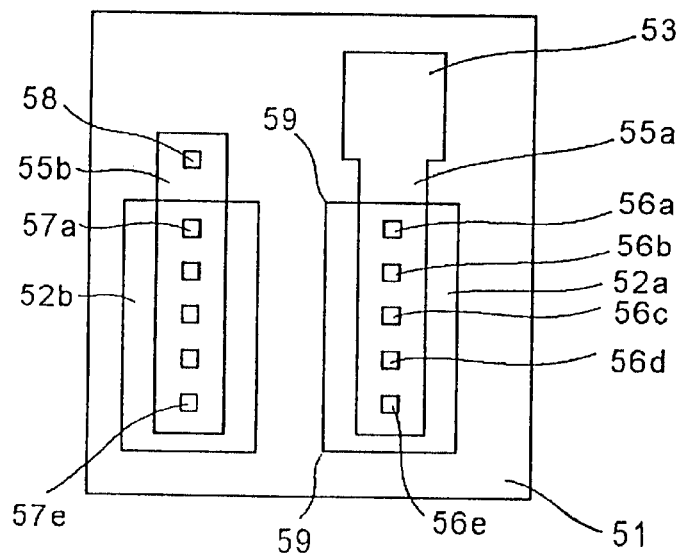
Figure 7A:
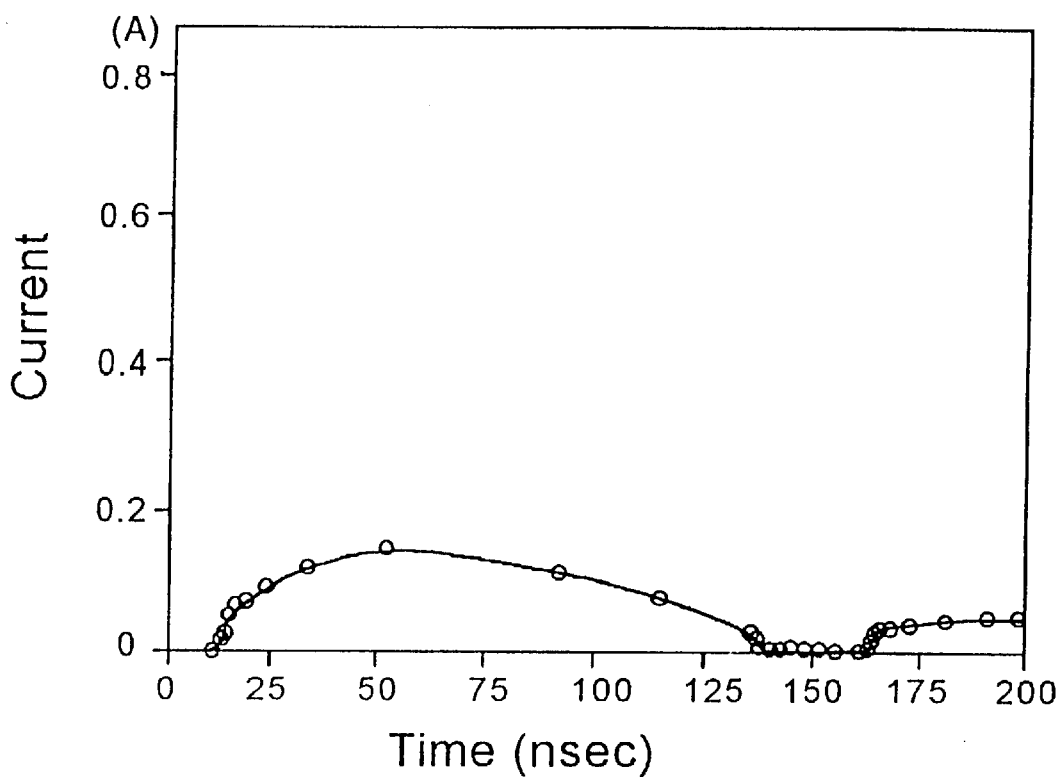
FIGS. 7(a) and (b) are a pair of graphs showing changes in the value of the current with time for the conventional EIAJ method (a) and for the EOS/ESD method (b) that is performed in the present invention.
Figure 7B:
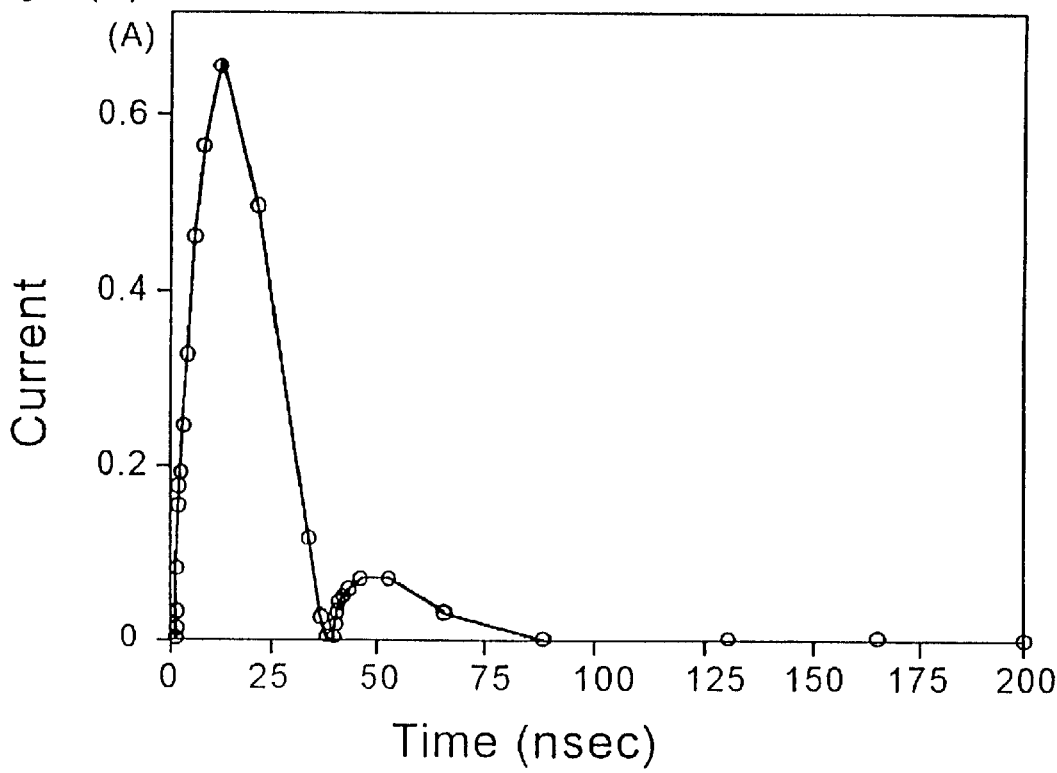
Figure 8:
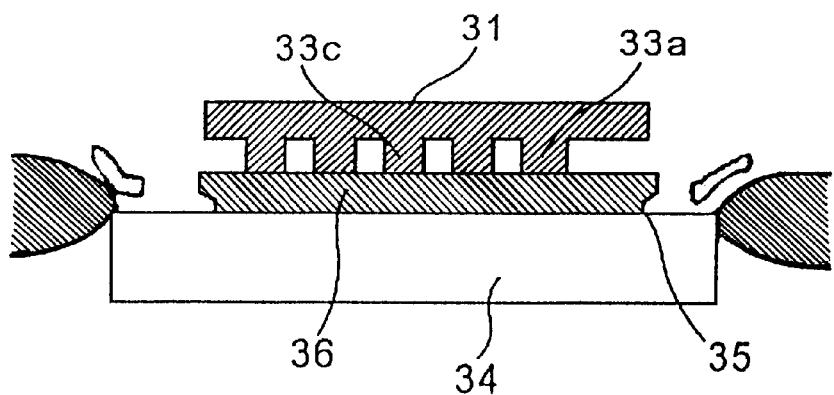
FIG. 8 is a cross-sectional view in explaining an example of conventional techniques.
Figure 9:
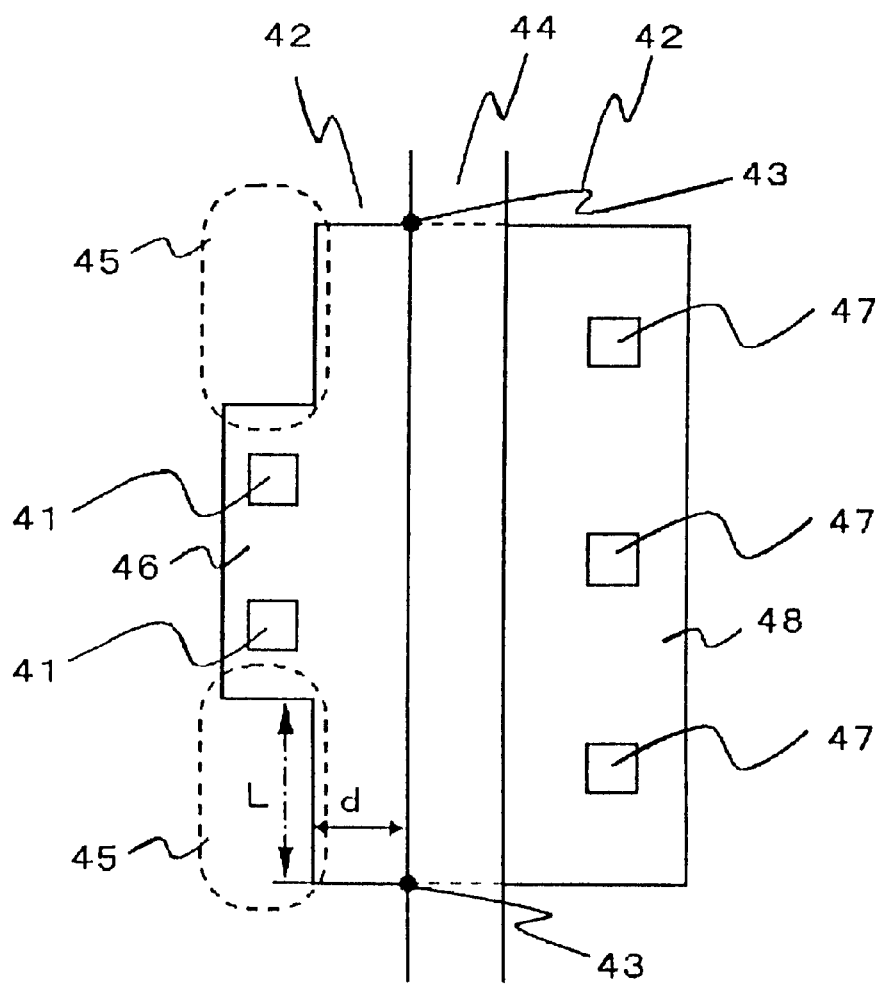
FIG. 9 is a plan view in explaining another example of conventional techniques.

When a test according to the EOS/ESD method shown in FIG. 6 was carried out in the way described above for semiconductor devices 100, each having an I/O protective section, the ESD withstand voltage distribution shown in the upper part of FIG. 5 was obtained. Against this, for semiconductor devices 100, each having a conventional I/O protective section formed without a preventive arrangement as the present invention, the distribution shown in the lower part of FIG. 5 was obtained. By comparison, the improvement in the withstand voltage achieved is approximately 50 V or so in average, and approximately 150 V for the minimum withstand voltage.

EXAMPLE 2

Referring to FIG. 4, the second example of the present invention is described.

As described for said Example 1, the openings for contacts can be made simultaneously in the I/O protective section as well as in the memory cell section. What the present example differs from Example 1 is a point that, without forming first 2 contacts 10 or intermediate wirings 12, contacts of the diffusion layer connected to an I/O pad are formed in such a way that one extra contact is added at each side of the contact array corresponding to that of the opposite electrode. Such an addition of one contact at each end section (a, a'), as shown in FIG. 4, makes the effective resistance between contacts a and c higher than that between contacts b and c. As for the contact pitches hereat, $L_1$ is formed to be 3 μm and $L_2$, 2 μm.

When the ESD withstand voltages for semiconductor devices each having an I/O protective section formed as described above were evaluated in the same way as for Example 1, a similar improvement in the withstand voltage by approximately 50 V or so in average was observed.

What is claimed is:

1. An input/output protective comprising:
   a protective element which induces an electric discharge between diffusion layers of a second conductive type which are disposed on a semiconductor substrate of a first conductive type and are facing each other; and
   a plurality of contacts each of which connects a metal wiring layer with at least one of the diffusion layers,
   wherein at least one contact of the plurality of contacts, the one contact being disposed at an end section of the protective element, has a higher resistance than others of the plurality of contacts.

2. The input/output protective device according to claim 1, wherein the one contact comprises a first contact touching one of the diffusion layers and a second contact touching the metal wiring layer, said first and second contacts are connected to each other through an intermediate wiring layer formed between said at least one of the diffusion layers and the metal wiring layer.

3. The input/output protective device according to claim 2, wherein an increase in the resistance is controlled by a length of the intermediate wiring layer between the first contact and the second contact.

4. The input/output protective device according to claim 2, wherein an increase in the resistance is controlled by a selection of a material for the intermediate wiring layer.

5. The input/output protective device according to claim 2, wherein said intermediate wiring layer is made of tungsten silicide.

6. The input/output protective device according to claim 2, wherein said first contact is formed of a material with a higher resistivity than said second contact.

7. The input/output protective device according to claim 6, wherein said first contact is formed by burying, simultaneously with formation of the intermediate wiring layer.

8. The input/output protective device according to claim 1, wherein the end section, which has the one contact provided thereon, is on a side closest to an input/output terminal.

9. An input/output protective device comprising:
   a first diffusion layer connected to an input/output terminal;

a second diffusion layer connected to a ground or supply potential or to a wiring fixed at a predetermined potential, the first diffusion layer and the second diffusion layer are arranged as facing each other on a surface of a semiconductor substrate; and a plurality of contacts for connecting wiring layers to the first and second diffusion layers, wherein the length of the first diffusion layer is larger at both end sections than the length of the second diffusion layer by at least one contact pitch length.

10. The input/output protective device according to claim 9, wherein a number of contacts of one contact array in the first diffusion layer is larger by one or more at the respective end section than that of one contact array in the second diffusion layer.

11. The input/output protective device according to claim 9, wherein the contact pitch of one contact array in the first diffusion layer is longer in the direction of the array than that of one contact array in the second diffusion layer.

* * * * *